(12) United States Patent
Hirao et al.

(10) Patent No.: US 11,521,925 B2
(45) Date of Patent: Dec. 6, 2022

(54) SEMICONDUCTOR MODULE

(71) Applicant: FUJI ELECTRIC CO., LTD., Kawasaki (JP)

(72) Inventors: Akira Hirao, Matsumoto (JP); Yoshinari Ikeda, Matsumoto (JP); Motohito Hori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 152 days.

(21) Appl. No.: 17/078,644

(22) Filed: Oct. 23, 2020

(65) Prior Publication Data

US 2021/0125916 A1 Apr. 29, 2021

(30) Foreign Application Priority Data

Oct. 28, 2019 (JP) .............................. JP2019-195161

(51) Int. Cl.
*H01L 23/528* (2006.01)
*H01L 23/498* (2006.01)
*H01L 23/00* (2006.01)

(52) U.S. Cl.
CPC ...... *H01L 23/528* (2013.01); *H01L 23/49811* (2013.01); *H01L 23/49844* (2013.01); *H01L 24/10* (2013.01); *H01L 24/33* (2013.01)

(58) Field of Classification Search
CPC ............. H01L 23/528; H01L 23/49811; H01L 23/49844; H01L 24/10; H01L 24/33
See application file for complete search history.

(56) References Cited

U.S. PATENT DOCUMENTS

| | | | |
|---|---|---|---|
| 9,106,124 B2 | 8/2015 | Bayerer et al. | |
| 2007/0252169 A1 | 11/2007 | Tokuyama et al. | |
| 2009/0246910 A1* | 10/2009 | Taniguchi | H01L 24/83 438/107 |
| 2011/0037166 A1* | 2/2011 | Ikeda | H01L 23/473 257/E23.101 |

(Continued)

FOREIGN PATENT DOCUMENTS

| | | |
|---|---|---|
| JP | H06204373 A | 7/1994 |
| JP | 2007299781 A | 11/2007 |

(Continued)

*Primary Examiner* — Nathan W Ha
(74) *Attorney, Agent, or Firm* — Rabin & Berdo, P.C.

(57) ABSTRACT

A semiconductor module, including a board that has first and second conductive plates located side by side on a first insulating plate, a first external connection terminal located on the first conductive plate, first and second semiconductor chips respectively disposed on the first and second conductive plates, and a printed-circuit board including a second insulating plate and first and second wiring boards located on a first principal plane of the second insulating plate. The first wiring board electrically connects an upper surface electrode of the first semiconductor chip and a relay area on the second conductive plate. The second wiring board is electrically connected to an upper surface electrode of the second semiconductor chip. The semiconductor module further includes a second external connection terminal electrically connected to an end portion of the second wiring board and formed on the second principal plane of the second insulating plate.

13 Claims, 13 Drawing Sheets

(56) References Cited

U.S. PATENT DOCUMENTS

| | | | |
|---|---|---|---|
| 2014/0346676 A1* | 11/2014 | Horio | H01L 25/18 |
| | | | 257/773 |
| 2015/0223339 A1 | 8/2015 | Nakamura et al. | |
| 2015/0380338 A1* | 12/2015 | Hori | H01L 25/073 |
| | | | 257/693 |
| 2016/0322287 A1* | 11/2016 | Nishizawa | H01L 23/5385 |
| 2017/0047923 A1* | 2/2017 | Inaba | H01L 29/1608 |
| 2017/0077068 A1* | 3/2017 | Horio | H01L 25/18 |
| 2019/0287887 A1 | 9/2019 | Nakamura et al. | |
| 2022/0077044 A1* | 3/2022 | Mitsumoto | H01L 23/49822 |

FOREIGN PATENT DOCUMENTS

| | | |
|---|---|---|
| JP | 2018050084 A | 3/2018 |
| JP | 2019161174 A | 9/2019 |
| WO | 2014061211 A1 | 4/2014 |

* cited by examiner

SEMICONDUCTOR MODULE

CROSS-REFERENCE TO RELATED APPLICATION

This application is based upon and claims the benefit of priority of the prior Japanese Patent Application No. 2019-195161, filed on Oct. 28, 2019, the entire contents of which are incorporated herein by reference.

BACKGROUND OF THE INVENTION

1. Field of the Invention

The embodiment discussed herein relates to a semiconductor module.

2. Background of the Related Art

Semiconductor modules include semiconductor chips such as an insulated gate bipolar transistor (IGBT) and a power metal oxide semiconductor field effect transistor (MOSFET). Semiconductor modules are used as power converters or the like. Such semiconductor modules include a substrate having an insulating plate and a plurality of conductive plates formed over the front surface of the insulating plate and a printed circuit board including semiconductor chips located over the conductive plates, a plurality of external connection terminals, a main circuit, and a control circuit and are sealed with a sealing member so as to be rectangular in plan view. The plurality of external connection terminals extend from the front surface of the sealing member, are electrically connected in the sealing member to the semiconductor chips, the main circuit, the control circuit, and the like, and function as P terminals, N terminals, intermediate terminals, and the like. Furthermore, the plurality of external connection terminals are arranged in two lines in the longitudinal direction of the sealing member (see, for example, International Publication Pamphlet No. WO2014/061211).

However, such semiconductor modules are rectangular in plan view. As a result, wiring distance inside them is long. For example, if a current inputted from an external connection terminal flows via the main circuit to a semiconductor chip and a current outputted from the semiconductor chip is outputted via the main circuit from an external connection terminal, then the currents flow along the long sides and wiring distance is long. This leads to an increase in inductance.

SUMMARY OF THE INVENTION

According to an aspect, there is provided a semiconductor module including a board including a first insulating plate having a first edge portion and a second edge portion that are opposite to each other, and a first conductive plate and a second conductive plate located side by side on a front surface of the first insulating plate; a first external connection terminal located on a front surface of the first conductive plate above the first edge portion of the first insulating plate; a first semiconductor chip with an upper surface electrode and a lower surface electrode, which are respectively a first upper surface electrode and a first lower surface electrode of the semiconductor module, the first lower surface electrode being disposed on the front surface of the first conductive plate, and being closer to the second edge portion of the first insulating plate than the first external connection terminal; a second semiconductor chip with an upper surface electrode and a lower surface electrode, which are respectively a second upper surface electrode and a second lower surface electrode of the semiconductor module, the second lower surface electrode being disposed on a front surface of the second conductive plate, and being closer to the second edge portion of the first insulating plate than the first external connection terminal; a printed-circuit board including a second insulating plate having a first principal plane facing the front surface of the first insulating plate, and a second principal plane opposite to the first principal plane, a first wiring board which is located on the first principal plane and which electrically connects the first upper surface electrode and a relay area on the front surface of the second conductive plate, the first wiring board being closer to the first conductive plate than the second semiconductor chip, and a second wiring board located on the first principal plane, electrically connected to the second upper surface electrode, and extending towards the first edge portion of the first insulating plate; and a second external connection terminal electrically connected to an end portion of the second wiring board and formed on the second principal plane of the second insulating plate.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described by reference to the accompanying drawings. In the following description a "front surface" or an "upper surface" indicates a surface of a semiconductor module 1 of FIG. 1 which faces upward. Similarly, an "upside" indicates the upper side of the semiconductor module 1 of FIG. 1. A "back surface" or a "lower surface" indicates a surface of the semiconductor module 1 of FIG. 1 which faces downward. Similarly, a "downside" indicates the lower side of the semiconductor module 1 of FIG. 1. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the embodiment. For example, the "upside" or the "downside" does not always mean the vertical direction relative to the ground. That is to say, a direction indicated by the "upside" or the "downside" is not limited to the gravity direction.

Figure 1:
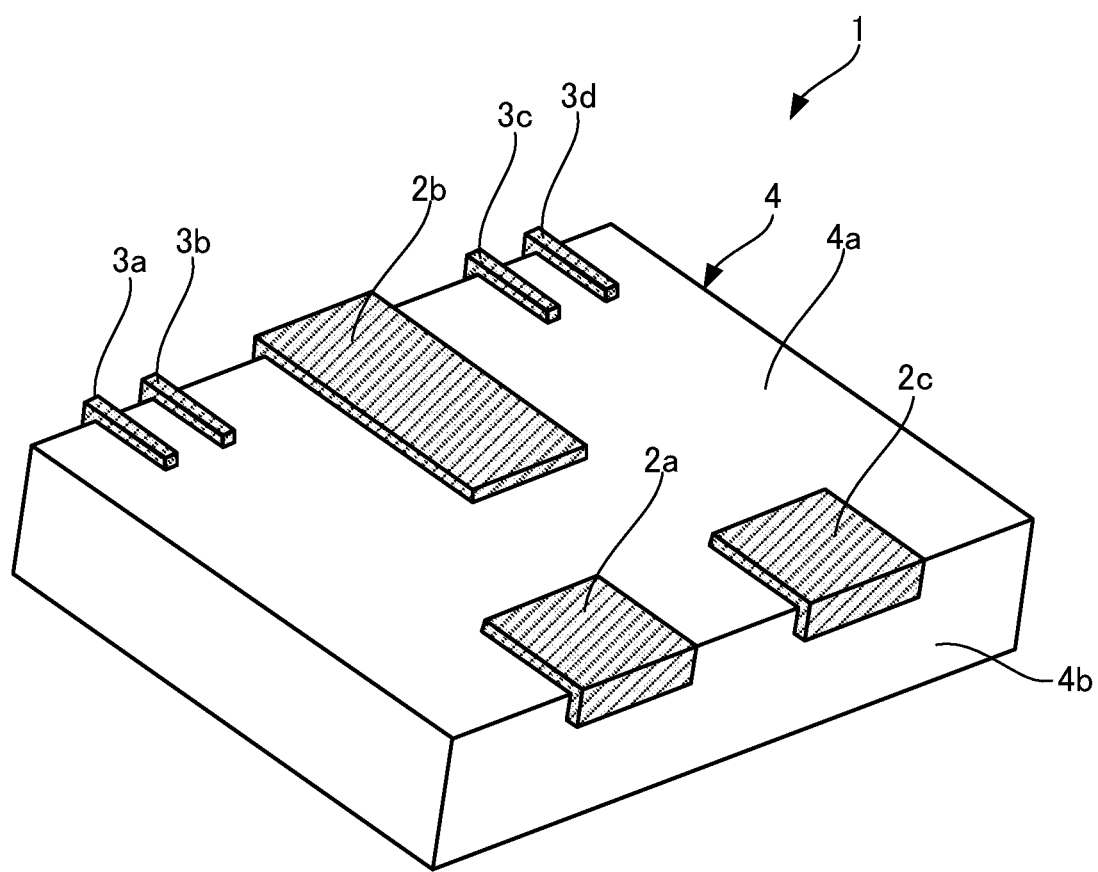
FIG. 1 is a perspective view of a semiconductor module according to an embodiment.

A semiconductor module according to an embodiment will be described by the use of FIG. 1. FIG. 1 is a perspective view of a semiconductor module according to an embodiment. A semiconductor module 1 includes a sealing member 4 molded so as to have the shape of a nearly rectangular parallelepiped and external connection terminals 2a, 2b, 2c, 3a, 3b, 3c, and 3d exposed from the sealing member 4. Parts, such as semiconductor chips, are sealed with the sealing member 4, and the semiconductor module 1 is molded so as to have the shape of a nearly rectangular parallelepiped. Furthermore, a radiation plate (not illustrated) is exposed on the back surface of the sealing member 4. The details of these parts will be described later. For example, the sealing member 4 may be silicone gel. In addition, for example, the sealing member 4 may contain a thermosetting resin, such as epoxy resin, phenolic resin, or maleimide resin, and a filler contained in a thermosetting resin.

The external connection terminals 2a, 2b, and 2c have the shape of a plate and are made of aluminum, iron, silver, copper, or an alloy containing at least one of them having good electrical conductivity. In addition, in order to improve corrosion resistance, metal, such as nickel or gold, may be formed on the surfaces of the external connection terminals 2a, 2b, and 2c by plating treatment or the like. To be concrete, a nickel-phosphorus alloy, a nickel-boron alloy, or the like may be used in place of nickel or gold. Moreover, gold may be laminated over a nickel-phosphorus alloy. One edge portion of each of the external connection terminals 2a, 2b, and 2c is sealed with the sealing member 4 so that the other edge portion of each of the external connection terminals 2a, 2b, and 2c will protrude (be exposed) from a front surface 4a of the sealing member 4. In the case of the semiconductor module 1 illustrated in FIG. 1, the external connection terminals 2a and 2c protruding from the front surface 4a are bent to the side of a side 4b so as to take the shape of the sealing member 4. Furthermore, the external connection terminal 2b protruding from the front surface 4a is also bent to the side of a side opposite the side 4b so as to take the shape of the sealing member 4.

For example, the external connection terminals 3a, 3b, 3c, and 3d have the shape of a prism and are made of aluminum, iron, silver, copper, or an alloy containing at least one of them having good electrical conductivity. In addition, in order to improve corrosion resistance, metal, such as nickel or gold, may be formed on the surfaces of the external connection terminals 3a, 3b, 3c, and 3d by plating treatment or the like. To be concrete, a nickel-phosphorus alloy, a nickel-boron alloy, or the like may be used in place of nickel or gold. Moreover, gold may be laminated over a nickel-phosphorus alloy. One edge portion of each of the external connection terminals 3a, 3b, 3c, and 3d is sealed with the sealing member 4 so that the other edge portion of each of the external connection terminals 3a, 3b, 3c, and 3d will protrude (be exposed) from the front surface 4a of the sealing member 4. This is the same with the external connection terminals 2a, 2b, and 2c. In the case of the semiconductor module 1 illustrated in FIG. 1, the external connection terminals 3a, 3b, 3c, and 3d protruding from the front surface 4a are bent to the side of the side opposite the side 4b so as to take the shape of the sealing member 4. The insulation of the semiconductor module 1 is kept by sealing the parts in this way with the sealing member 4. Moreover, a lead frame integrally formed with the external connection terminals 2a, 2b, 2c, 3a, 3b, 3c, and 3d is used, the parts are sealed by transfer molding with the sealing member 4, and needless portions are removed from the lead frame. By doing so, the semiconductor module 1 is formed. As a result, the semiconductor module 1 is easily formed.

Figure 2:
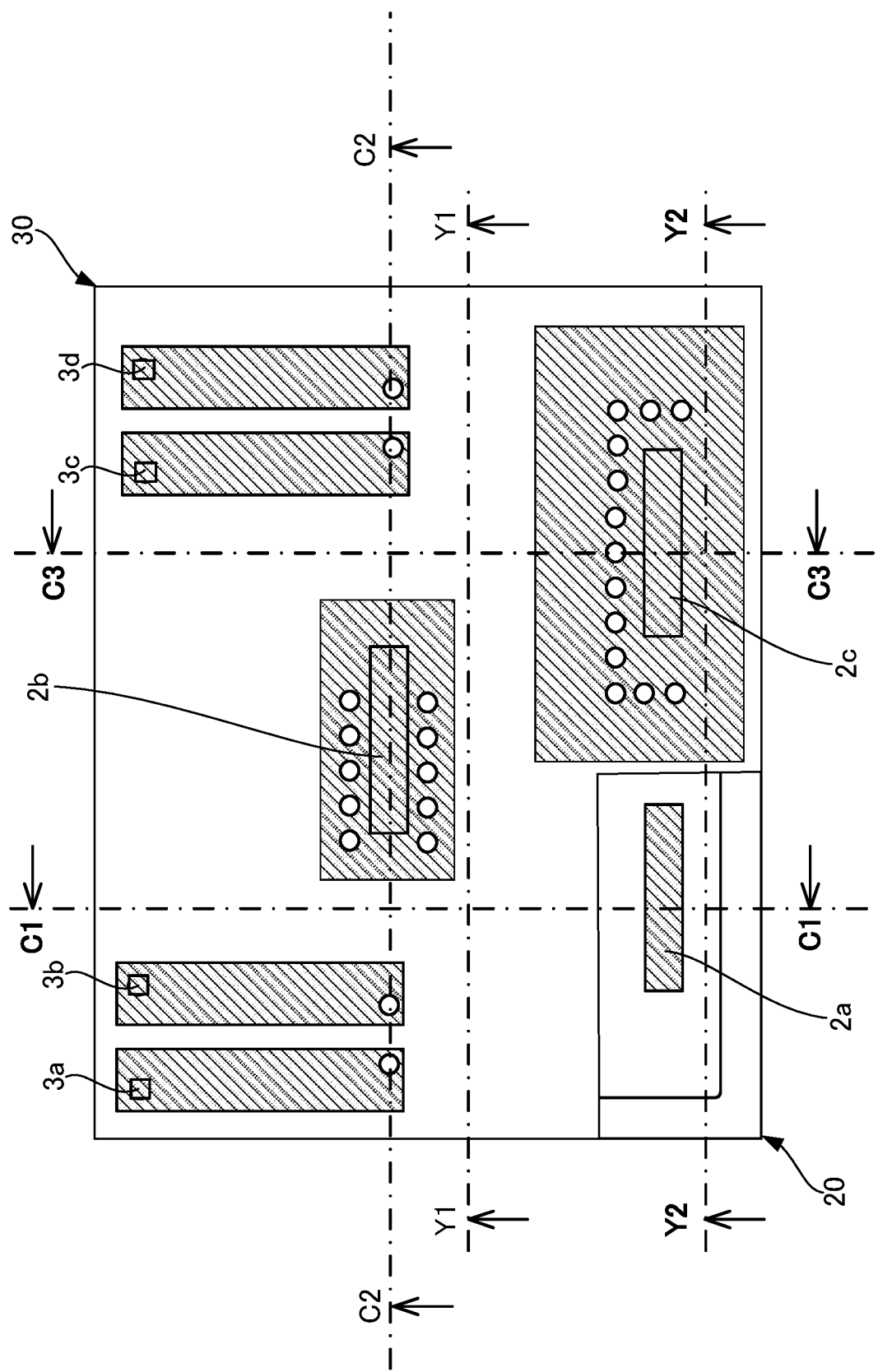
FIG. 2 is a plan view of the semiconductor module according to the embodiment.
Figure 3:
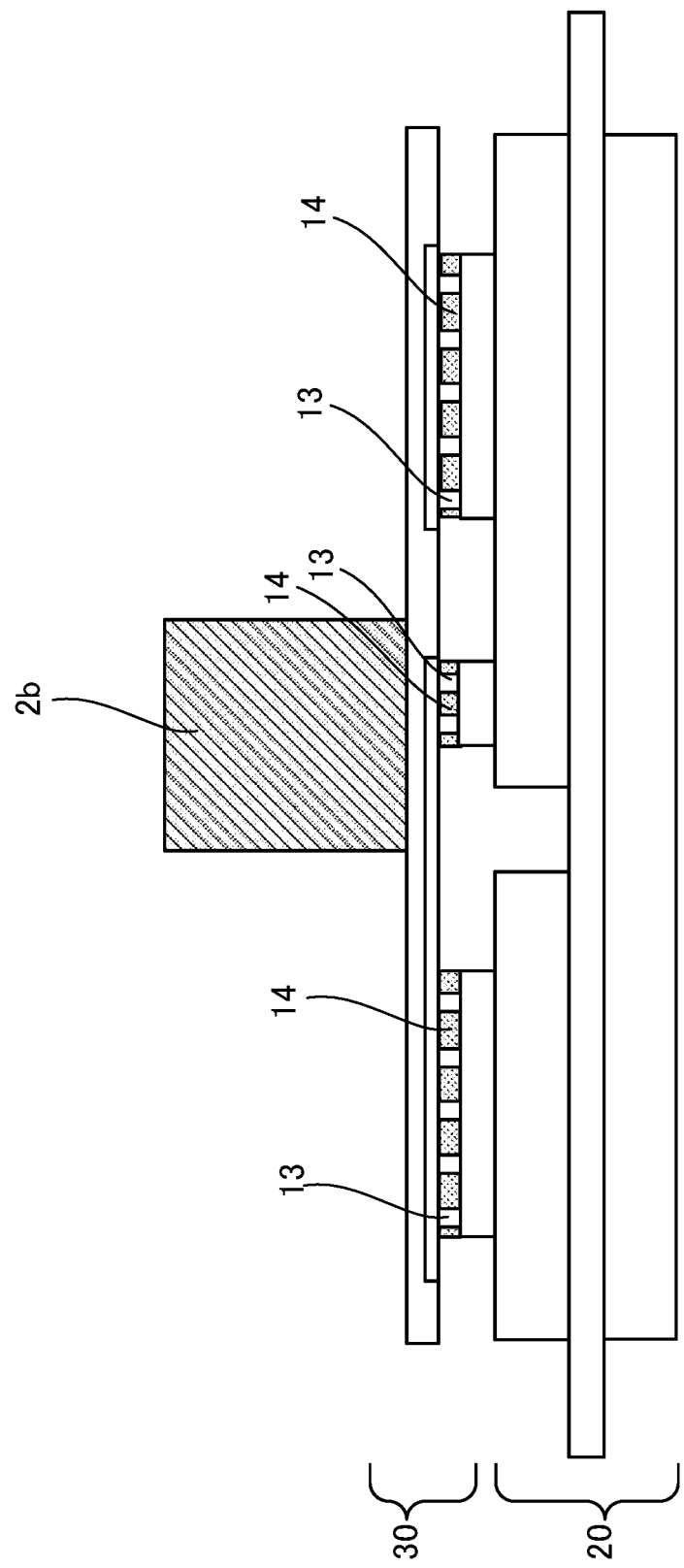
FIG. 3 is a sectional view of the semiconductor module according to the embodiment (part 1)
Figure 4:
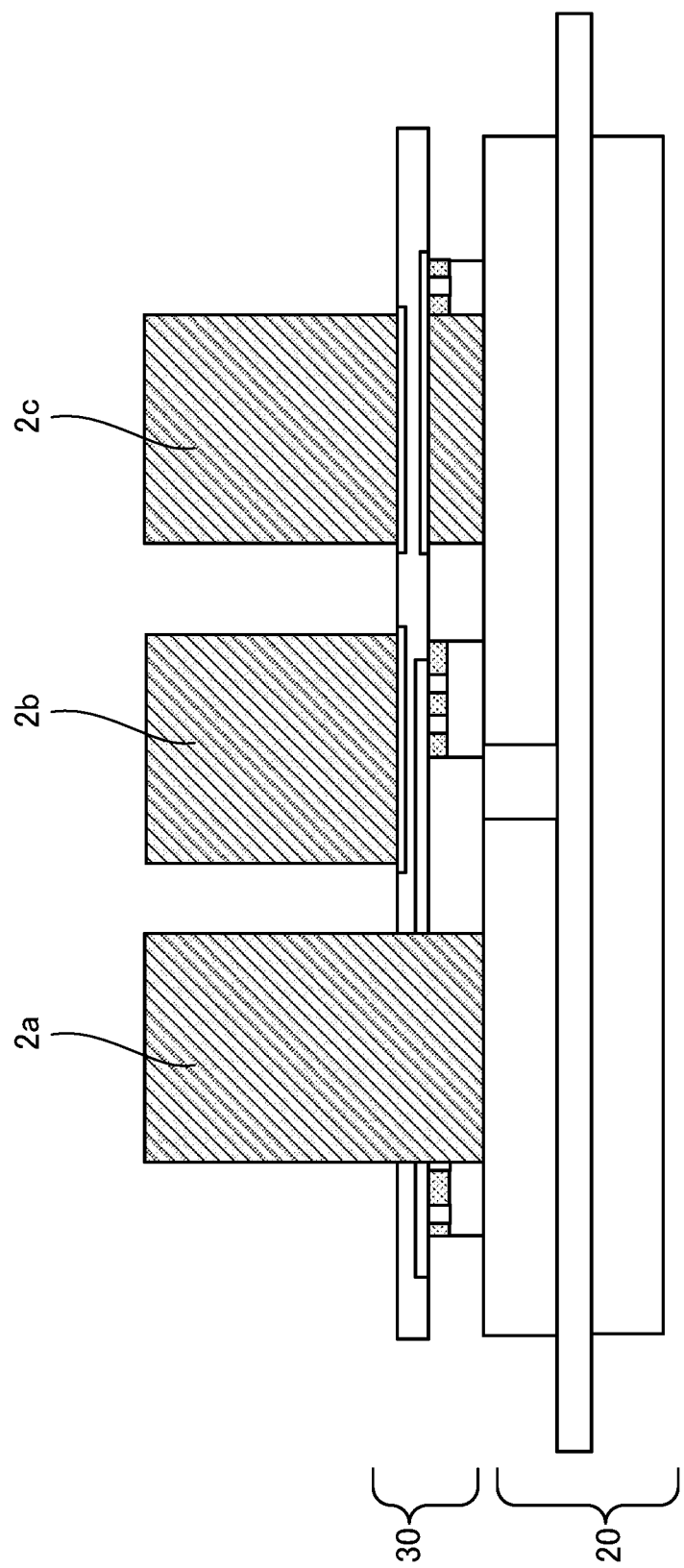
FIG. 4 is a sectional view of the semiconductor module according to the embodiment (part 2)

The parts of the semiconductor module 1 sealed with the sealing member 4 will now be described by the use of FIGS. 2 through 4. FIG. 2 is a plan view of the semiconductor module according to the embodiment. FIGS. 3 and 4 are sectional views of the semiconductor module according to the embodiment. FIGS. 2 through 4 illustrate a case where the semiconductor module 1 is not sealed with the sealing member 4. Furthermore, in FIGS. 2 through 4 the external connection terminals 2a, 2b, 2c, 3a, 3b, 3c, and 3d extend perpendicularly to the front surface 4a of the semiconductor module 1. FIG. 3 is a sectional view taken along the dot-dash line Y1-Y1 of FIG. 2. FIG. 4 is a sectional view taken along the dot-dash line Y2-Y2 of FIG. 2.

With the semiconductor module 1 a ceramic circuit board 20 and a printed-circuit board 30 are sealed with the sealing member 4. The external connection terminals 2a and 2c are formed on the ceramic circuit board 20. The printed-circuit board 30 has the shape of the letter "L" in plan view and has a notch portion in a place corresponding to an area including the external connection terminal 2a. The external connection terminal 2c is electrically connected to and inserted into the printed-circuit board 30. Furthermore, the external connection terminal 2b is electrically connected to and formed on the printed-circuit board 30. In addition, the external connection terminals 3a and 3b are electrically connected to and formed on the printed-circuit board 30. Moreover, the external connection terminals 3c and 3d are electrically connected to and formed on the printed-circuit board 30.

Semiconductor chips and the like of the ceramic circuit board 20 and wiring boards of the printed-circuit board 30 are electrically connected by connecting members 13. The connecting members 13 are formed at needed points by plating, sputtering, or sintering by the use of gold, silver, copper, or an alloy containing at least one of them. Conductive posts or the like may be used as the connecting members 13. It is possible to bond the semiconductor chips and the like of the ceramic circuit board 20 and the wiring boards of the printed-circuit board 30 together by the use of the connecting members 13 without press-fitting conductive posts or the like. In this way, the ceramic circuit board 20 and the printed-circuit board 30 do not need to be processed. Furthermore, because press-fitting is not performed, the ceramic circuit board 20 or the printed-circuit board 30 is not deformed. In particular, if a wide-band-gap semiconductor, such as silicon carbide, gallium nitride, or gallium oxide, is used as a semiconductor chip, then miniaturization of the semiconductor chip is realized. In this case, the area of a semiconductor chip is too small to bond a lead frame, a wire, or the like thereto. Accordingly, electrical bonding to a miniaturized semiconductor chip is realized by using bumps as the connecting members 13 which are able to be microfabricated. Furthermore, a gap between the ceramic circuit board 20 and the printed-circuit board 30 becomes narrower by using such bumps as the connecting members 13. For example, this gap is wider than or equal to 50 μm and narrower than or equal to 100 μm. In order to keep the insulation of this gap, a sealing member 14 is injected between the connecting members 13 in the gap. For example, the sealing member 14 contains a thermosetting resin, such as epoxy resin, phenolic resin, or maleimide resin, and a filler contained in a thermosetting resin. In FIG. 4, the numerals of the connecting members 13 and the sealing member 14 are omitted.

Figure 5:
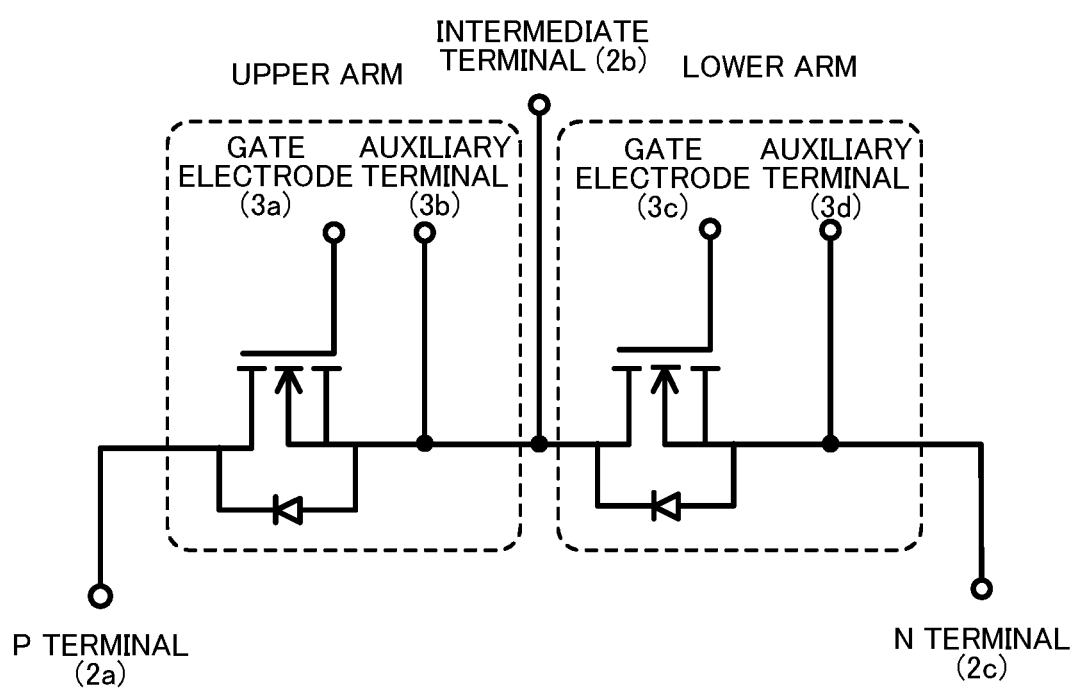
FIG. 5 illustrates an equivalent circuit realized by the semiconductor module according to the embodiment.

An equivalent circuit realized by the semiconductor module 1 including the ceramic circuit board 20 and the printed-circuit board 30 will be described by the use of FIG. 5 and FIGS. 1 through 4. FIG. 5 illustrates an equivalent circuit realized by the semiconductor module according to the embodiment. A source electrode of an upper arm power MOSFET is electrically connected to the external connection terminal 2a of the semiconductor module 1 which is a P terminal. In addition, the external connection terminal 3a is electrically connected to a gate electrode of the upper arm power MOSFET. The external connection terminal 3b which is an auxiliary terminal is electrically connected to a drain electrode of the upper arm power MOSFET. Moreover, the drain electrode of the upper arm power MOSFET and a source electrode of a lower arm power MOSFET are electrically connected to each other. The external connection terminal 2b which is an intermediate terminal is electrically connected to the drain electrode of the upper arm power MOSFET and the source electrode of the lower arm power MOSFET. The external connection terminal 3c is electrically connected to a gate electrode of the lower arm power MOSFET. The external connection terminal 3d which is an auxiliary terminal is electrically connected to a drain electrode of the lower arm power MOSFET. Furthermore, the external connection terminal 2c which is an N terminal is connected to the drain electrode of the lower arm power MOSFET. The upper arm and the lower arm made up of the semiconductor module 1 will be described later.

Figure 6:
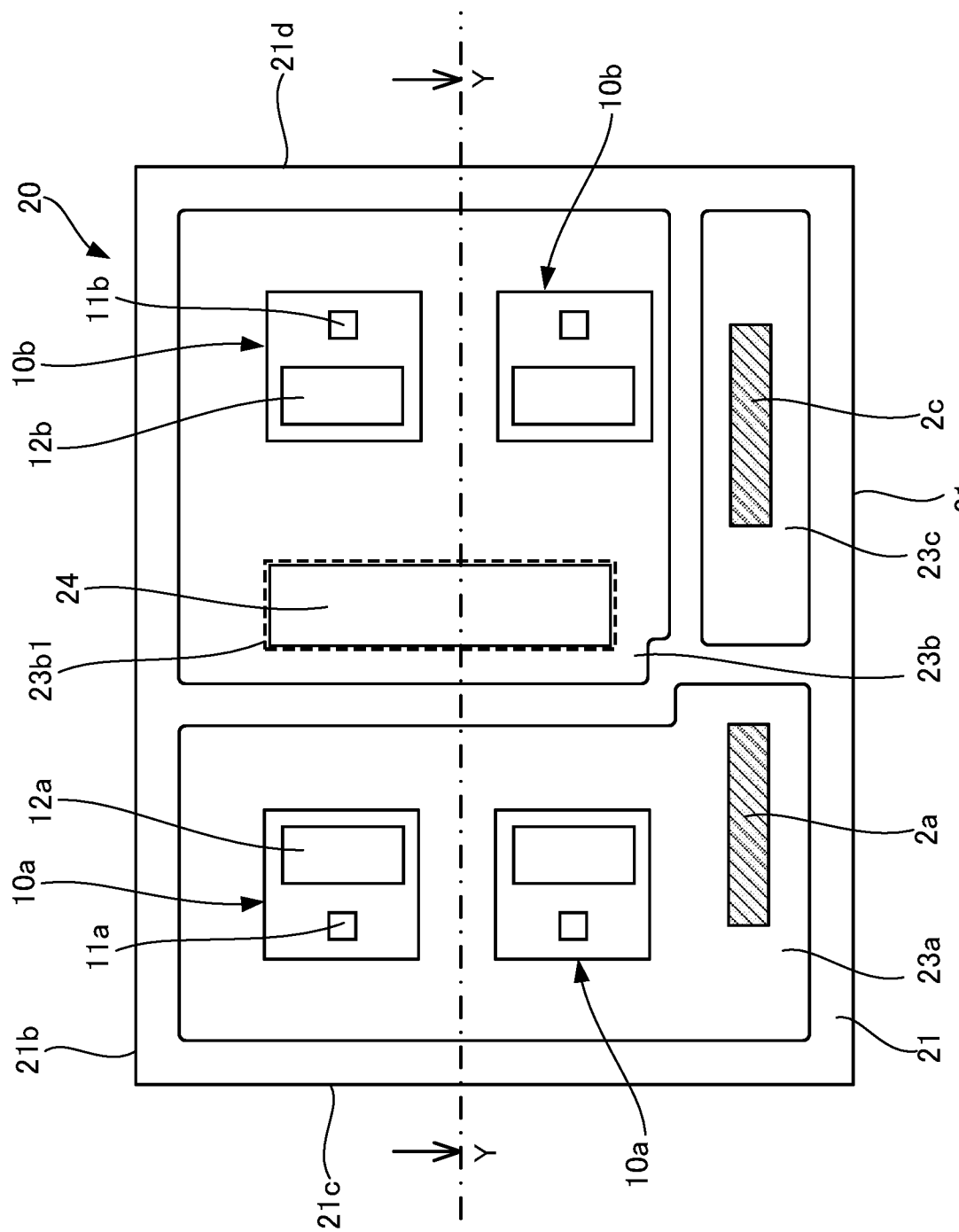
FIG. 6 is a plan view of a ceramic circuit board included in the semiconductor module according to the embodiment.
Figure 7:
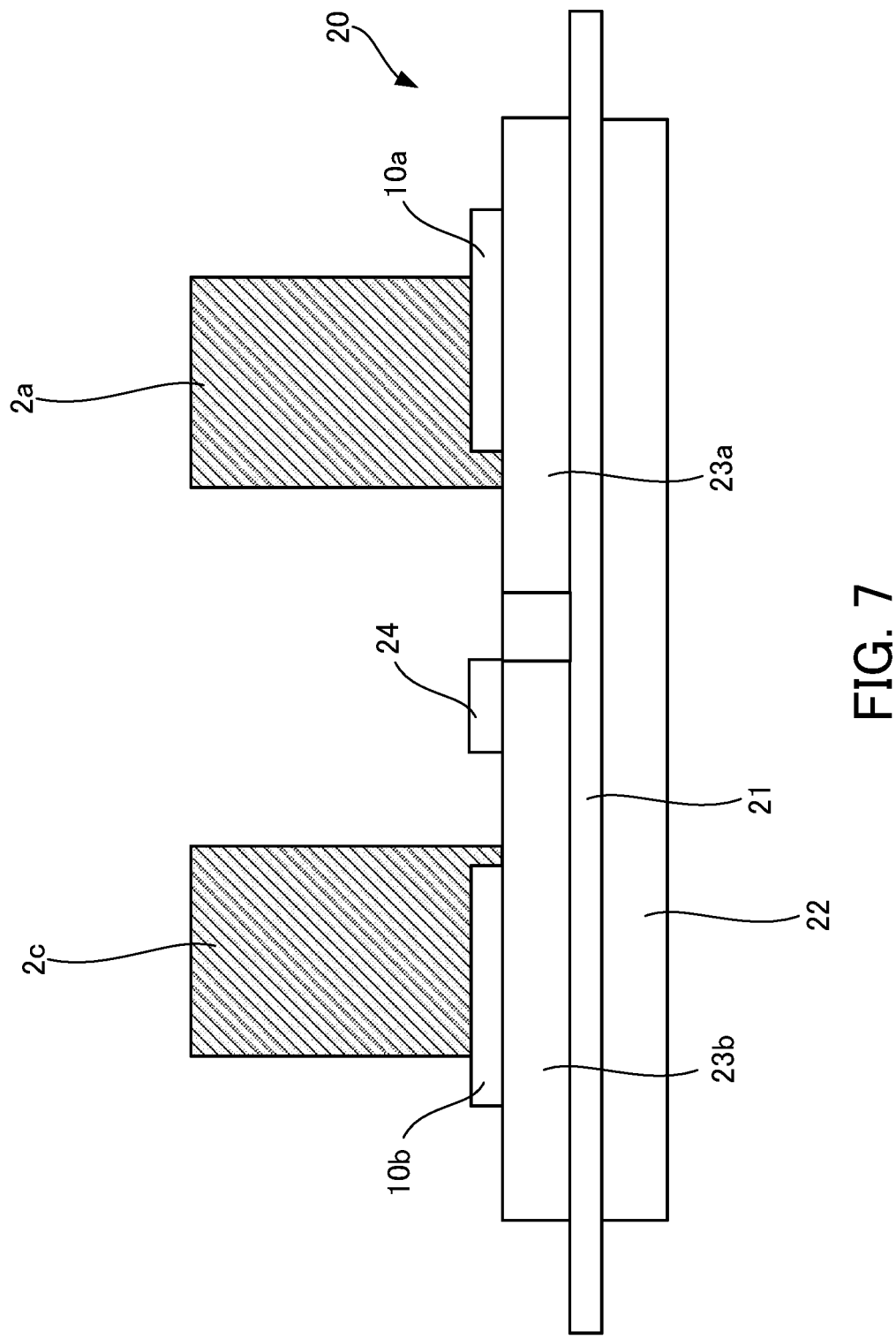
FIG. 7 is a sectional view of the ceramic circuit board included in the semiconductor module according to the embodiment.

The ceramic circuit board 20 and the printed-circuit board 30 included in the semiconductor module 1 will now be described. First the ceramic circuit board 20 will be described by the use of FIGS. 6 and 7. FIG. 6 is a plan view of the ceramic circuit board included in the semiconductor module according to the embodiment. FIG. 7 is a sectional view of the ceramic circuit board included in the semiconductor module according to the embodiment. FIG. 7 is a sectional view taken along the dot-dash line Y-Y of FIG. 6.

The ceramic circuit board 20 includes an insulating plate 21, a radiation plate 22 formed on the back surface of the insulating plate 21, and conductive plates 23a, 23b, and 23c formed over the front surface of the insulating plate 21. Furthermore, a conductive block 24 is located in a relay area 23b1 of the conductive plate 23b.

The insulating plate 21 is made of a ceramic, such as aluminum oxide, aluminum nitride, or silicon nitride, having high thermal conductivity. Furthermore, the insulating plate 21 is nearly rectangular and has long sides 21a and 21b (one edge portion and the other edge portion) opposite each other and short sides 21c and 21d opposite each other. The radiation plate 22 is made of metal, such as aluminum, iron, silver, copper, or an alloy containing at least one of them, having high thermal conductivity. The conductive plates 23a, 23b, and 23c are made of metal, such as copper or a copper alloy, having good electrical conductivity. The number or shape of the conductive plates 23a, 23b, and 23c is an example. Another number of conductive plates or conductive plates having another shape may be used at need. A direct copper bonding (DCB) substrate, an active metal brazed (AMB) substrate, or the like may be used as the ceramic circuit board 20 having the above structure.

Furthermore, the conductive plate 23a is located over the nearly left half in FIG. 6 of the insulating plate 21 between the long sides 21a and 21b along the short side 21c of the insulating plate 21. The external connection terminal 2a is formed on the side of the long side 21a of the insulating plate 21. In addition, semiconductor chips 10a are disposed on the side of the long side 21b from the external connection terminal 2a. In this case, lower surface electrodes (not illustrated) on the back surfaces of the semiconductor chips 10a are disposed parallel to the short side 21c of the insulating plate 21 and are electrically bonded to the conductive plate 23a by the use of solder, a nano-silver paste, a direct bonding technique, or the like.

The conductive plate 23b is located over a nearly upper right portion in FIG. 6 of the insulating plate 21 between the long sides 21a and 21b along the short side 21d of the insulating plate 21. In addition, semiconductor chips 10b are disposed parallel to the short side 21d of the insulating plate 21 over the conductive plate 23b along the short side 21d. In this case, lower surface electrodes (not illustrated) on the back surfaces of the semiconductor chips 10b are disposed along the short side 21d of the insulating plate 21 and are also electrically bonded to the conductive plate 23b by the use of solder, a nano-silver paste, a direct bonding technique, or the like. Furthermore, the conductive block 24 is formed over the relay area 23b1 of the conductive plate 23b. The relay area 23b1 is set on the conductive plate 23b on the side of the conductive plate 23a from the semiconductor chips 10b. The conductive block 24 is made of metal, such as copper or a copper alloy, having good electrical conductivity. The conductive block 24 and the semiconductor chips 10a and 10b are at the same level. As a result, when the printed-circuit board 30 described later is disposed over the ceramic circuit board 20 and the printed-circuit board 30 and the conductive plate 23b are electrically connected to each other, the printed-circuit board 30 and the conductive plate 23b are reliably connected electrically to each other by the connecting members 13. This is the same with the semiconductor chips 10a and 10b. Moreover, a case other than the case of FIG. 6 is possible. A plurality of conductive blocks 24 may be formed in the relay area 23b1. The conductive plate 23c is located over a nearly lower right portion in FIG. 6 of the insulating plate 21 between the long sides 21a and 21b along the short side 21d of the insulating plate 21. The external connection terminal 2c is formed over the insulating plate 21.

A base plate (not illustrated) may be located on the back surface of the radiation plate 22 of the ceramic circuit board 20 exposed from the back surface of the sealing member 4 of the semiconductor module 1 with solder, silver solder or the like therebetween. For example, the base plate is made of aluminum, iron, silver, copper, or an alloy containing at least one of them having high thermal conductivity. In addition, in order to improve corrosion resistance, a material, such as nickel, may be formed on the surface of the base plate by plating treatment or the like. Furthermore, a cooler (not illustrated) may be fixed to the back surface of the radiation plate 22 to improve a heat dissipation property. For example, this cooler is made of aluminum, iron, silver, copper, or an alloy containing at least one of them having high thermal conductivity. Moreover, a fin, a heat sink made up of a plurality of fins, a water-cooling cooler, or the like may be used as the cooler. In addition, the base plate and the cooler may be integrally formed. In that case, the base plate and the cooler are made of aluminum, iron, silver, copper, or an alloy containing at least one of them having high thermal conductivity. Furthermore, in order to improve corrosion resistance, a material, such as nickel, may be formed on the surface of the base plate integrally formed with the cooler by plating treatment or the like.

The semiconductor chips 10a and 10b include a switching element, such as an IGBT or a power MOSFET, made of silicon. Furthermore, the semiconductor chips 10a and 10b may be made of a wide-band-gap semiconductor such as silicon carbide, gallium nitride, or gallium oxide. For example, the semiconductor chips 10a and 10b have drain electrodes (or collector electrodes) as lower surface electrodes on the back surfaces and have gate electrodes as control electrodes 11a and 11b and source electrodes (or emitter electrodes) as upper surface electrodes 12a and 12b on the front surfaces. In addition, if the semiconductor chips 10a and 10b include a power MOSFET, then the semiconductor chips 10a and 10b include a body diode as illustrated in FIG. 5. In this case, the body diode is connected in a direction opposite to the direction of the power MOSFET. These semiconductor chips 10a and 10b have cathode electrodes as lower surface electrodes on the back surfaces and have anode electrodes as upper surface electrodes on the front surfaces. In this embodiment, as illustrated in FIG. 5, power MOSFETs are located as the semiconductor chips 10a and 10b. Moreover, electronic parts may be located at need in addition to the semiconductor chips 10a and 10b. Such electronic parts are resistors, thermistors, capacitors, surge absorbers, or the like.

Figure 8:
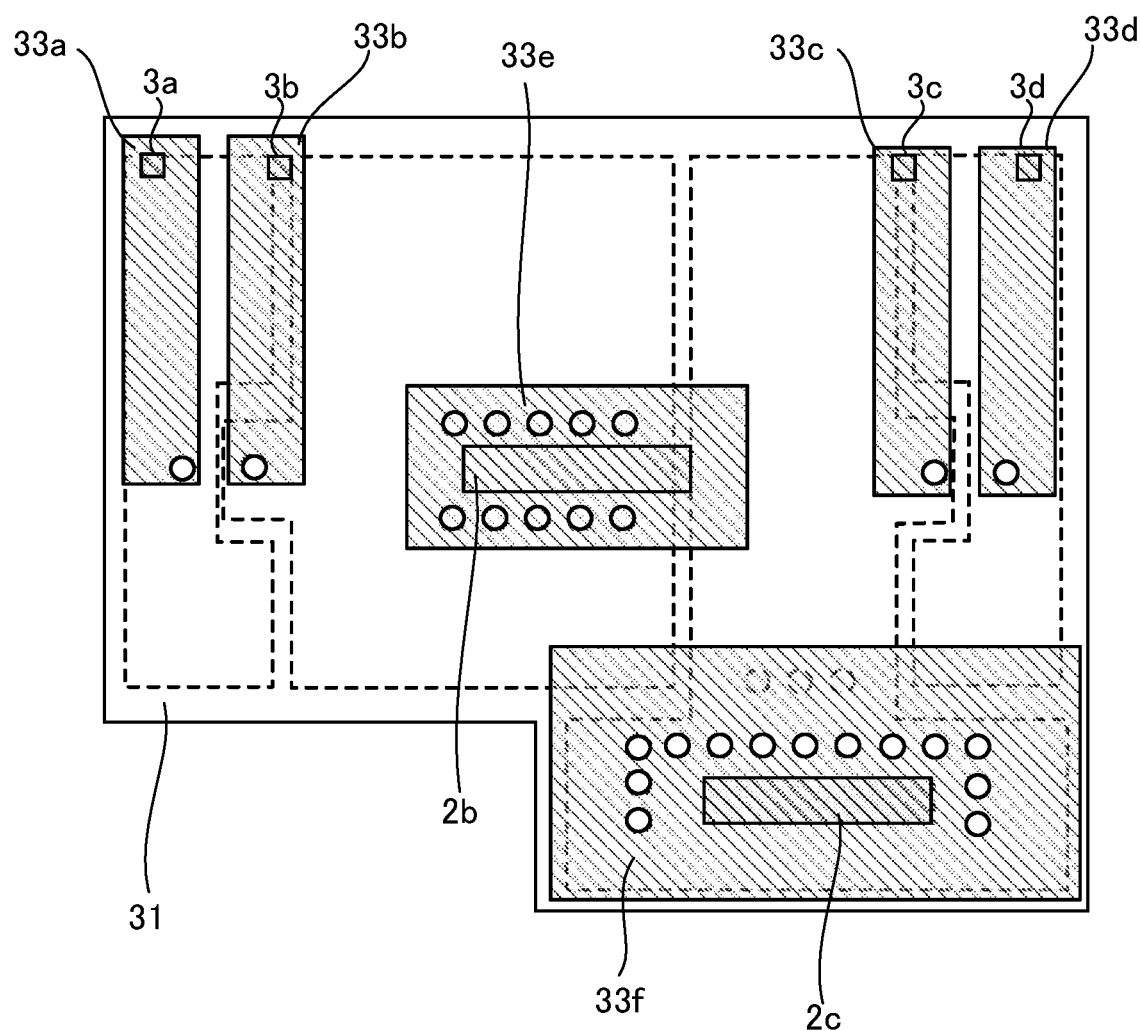
FIG. 8 is a plan view of a wiring board (on the front surface side) of a printed-circuit board included in the semiconductor module according to the embodiment.
Figure 9:
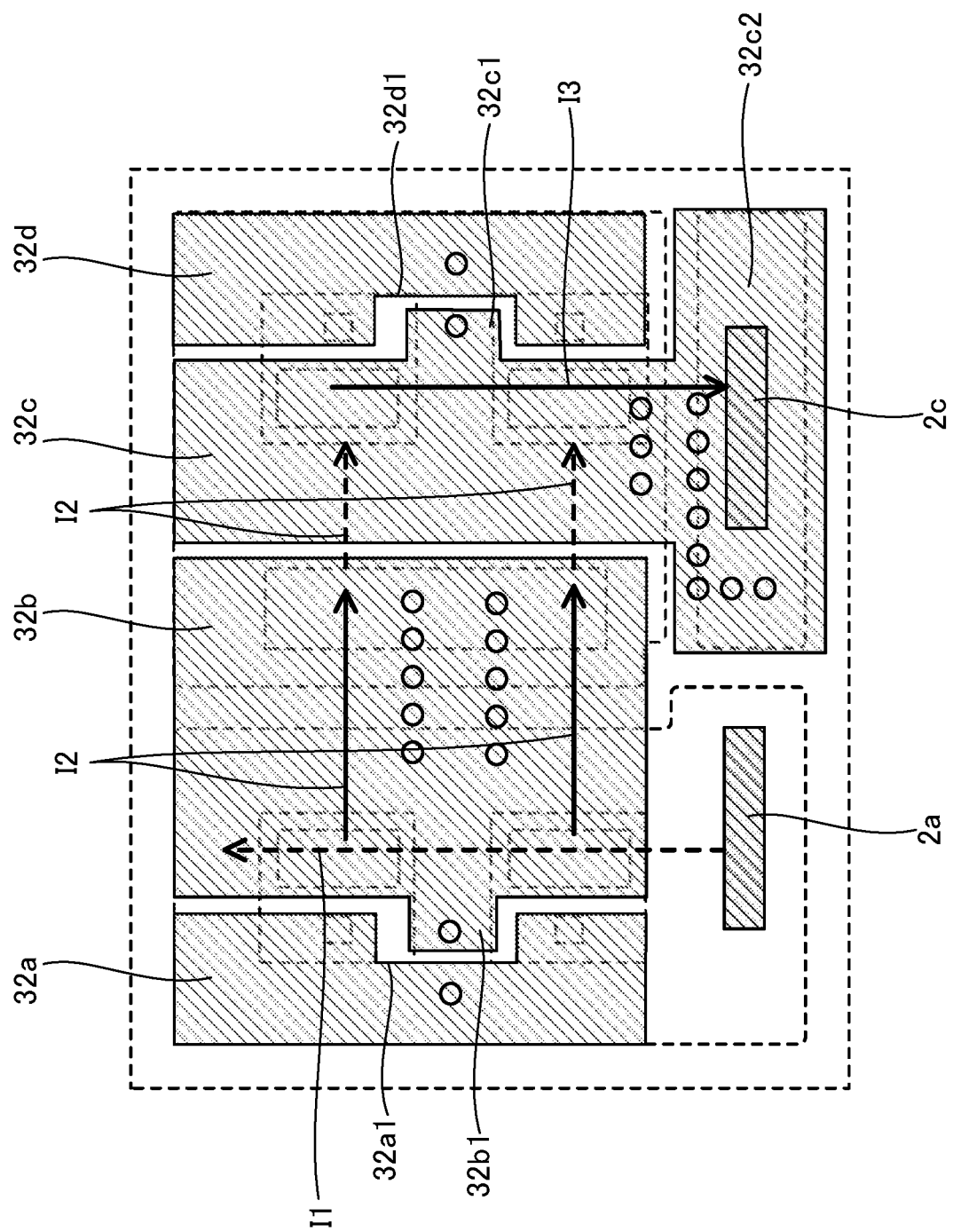
FIG. 9 is a plan view of a wiring board (on the back surface side) of the printed-circuit board included in the semiconductor module according to the embodiment.

The printed-circuit board 30 will now be described by the use of FIGS. 8 and 9. FIG. 8 is a plan view of a wiring board (on the front surface side) of the printed-circuit board included in the semiconductor module according to the embodiment. FIG. 9 is a plan view of a wiring board (on the back surface side) of the printed-circuit board included in the semiconductor module according to the embodiment. Solid line arrows and dashed arrows I1, I2, and I3 in FIG. 9 indicate conduction directions. These conduction directions will be described later. Furthermore, FIG. 9 illustrates a wiring board located on the back surface of the printed-circuit board and viewed from the front surface of the printed-circuit board 30. In this case, positions in which the conductive plates 23a, 23b, and 23c and the semiconductor chips 10a and 10b of the ceramic circuit board 20 are disposed are indicated by dashed lines. However, their numerals are omitted.

As illustrated in FIG. 8, the printed-circuit board 30 includes an insulating board 31 and wiring boards 33a, 33b, 33c, 33d, 33e, and 33f formed over the front surface of the insulating board 31. In FIG. 8, the positions of wiring boards formed on the back surface of the insulating board 31 and described later are indicated by dashed lines. The insulating board 31 has the shape of the letter "L" and has a notch portion formed in a lower left area. A glass composite board, a glass epoxy board, a glass polyimide board, or the like is used as the insulating board 31. A glass composite board is made by impregnating glass fiber with epoxy resin. A glass epoxy board is made by impregnating a glass woven fabric into which glass fiber is woven with epoxy resin. The wiring boards 33a, 33b, 33c, 33d, 33e, and 33f are made of metal, such as copper or a copper alloy, having good electrical conductivity. Furthermore, the external connection terminal 3a is connected to one end portion of the wiring board 33a. The external connection terminal 3b is connected to one end portion of the wiring board 33b. The external connection terminal 3c is connected to one end portion of the wiring board 33c. The external connection terminal 3d is connected to one end portion of the wiring board 33d. The wiring board 33e is formed over nearly the center of the insulating board 31 and the external connection terminal 2b is formed thereon. In this case, the external connection terminal 2b is disposed so as to correspond to an upper portion of the conductive block 24. In addition, the wiring board 33f is formed over a lower right edge portion of the insulating board 31. The external connection terminal 2c formed on the conductive plate 23c of the ceramic circuit board 20 pierces the wiring board 33f and is electrically connected to the wiring board 33f. Circles on the wiring boards 33a, 33b, 33c, 33d, 33e, and 33f indicate vias. The wiring boards 33a, 33b, 33c, 33d, 33e, and 33f are electrically connected via the vias which pierce the insulating board 31 to the wiring boards formed on the back surface of the insulating board 31 and described later.

Moreover, as illustrated in FIG. 9, wiring boards 32a, 32b, 32c, and 32d are formed on the back surface of the above insulating board 31. The wiring boards 32a, 32b, 32c, and 32d are also made of metal, such as copper or a copper alloy, having good electrical conductivity. FIG. 9 illustrates the wiring boards 32a, 32b, 32c, and 32d viewed from the front surface of the printed-circuit board 30. Furthermore, in FIG. 9, the conductive plates 23a, 23b, and 23c and the semiconductor chips 10a and 10b of the ceramic circuit board 20 are indicated by dashed lines. Their numerals are omitted. In addition, circles on the wiring boards 32a, 32b, 32c, and 32d indicate the positions of vias. The wiring boards 32a, 32b, 32c, and 32d are electrically connected by these vias to the wiring boards 33a, 33b, 33c, 33d, 33e, and 33f formed over the front surface of the insulating board 31.

The wiring board 32a is located on the back surface of the insulating board 31 so that, when the printed-circuit board 30 is bonded to the ceramic circuit board 20, the wiring board 32a is electrically connected to the control electrodes 11a of the semiconductor chips 10a. With the wiring board 32a a concave portion 32a1 is formed in an area corresponding to a central portion of an area in which the semiconductor chips 10a are disposed. The wiring board 32b is located on the back surface of the insulating board 31 so that, when the printed-circuit board 30 is bonded to the ceramic circuit board 20, the wiring board 32b is electrically connected to the upper surface electrodes 12a of the semiconductor chips 10a and the conductive block 24. With the wiring board 32b a convex portion 32b1 which enters the concave portion 32a1 of the wiring board 32a is formed. The wiring boards 33a and 33b formed over the front surface of the insulating board 31 are electrically connected to the wiring boards 32a and 32b at a position indicated by a circle near the concave portion 32a1 of the wiring board 32a and a position indicated by a circle near the convex portion 32b1 of the wiring board 32b, respectively.

When the printed-circuit board 30 is bonded to the ceramic circuit board 20, the wiring board 32c is electrically connected to the upper surface electrodes 12b of the semiconductor chips 10b and extends downward over the insulating board 31. The wiring board 32c extending in this way includes a terminal area 32c2. The external connection terminal 2c formed on the conductive plate 23c of the ceramic circuit board 20 pierces the terminal area 32c2 and is electrically connected to the terminal area 32c2. When the printed-circuit board 30 is disposed over the ceramic circuit board 20, the terminal area 32c2 is situated over the conductive plate 23c of the ceramic circuit board 20. With the wiring board 32c a convex portion 32c1 protruding to the side of the wiring board 32d is formed in an area corresponding to a central portion of an area in which the semiconductor chips 10b are disposed. The wiring board 32d is located on the back surface of the insulating board 31 so that when the printed-circuit board 30 is bonded to the ceramic circuit board 20, the wiring board 32d is electrically connected to the control electrodes 11b of the semiconductor chips 10b. Furthermore, with the wiring board 32d a concave portion 32d1 is formed in the area corresponding to the central portion of the area in which the semiconductor chips 10b are disposed. The convex portion 32c1 of the wiring board 32c enters the concave portion 32d1. The wiring boards 33c and 33d formed over the front surface of the insulating board 31 are electrically connected to the wiring boards 32c and 32d at a position indicated by a circle near the convex portion 32c1 of the wiring board 32c and a position indicated by a circle near the concave portion 32d1 of the wiring board 32d, respectively.

Figure 10:
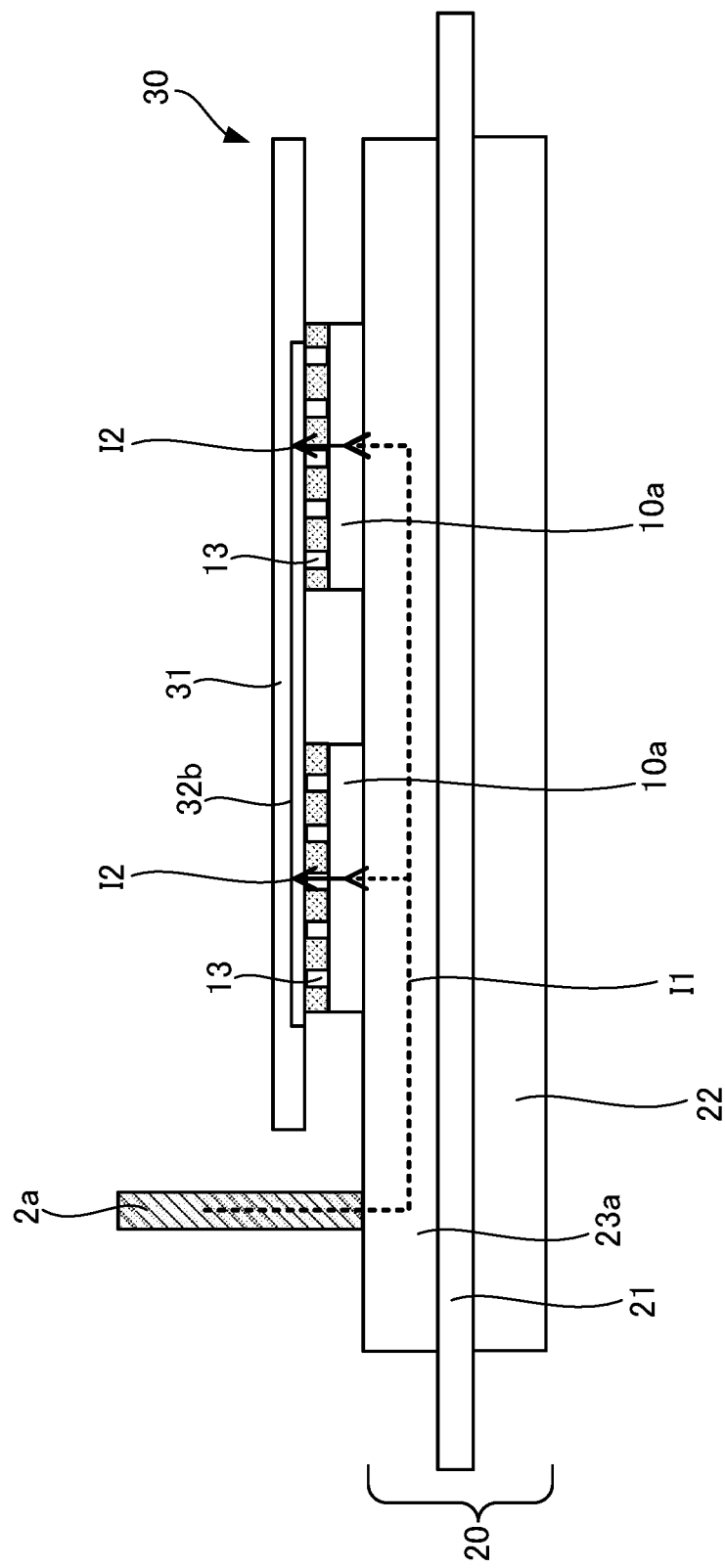
FIG. 10 is a view for describing a conduction path in the semiconductor module according to the embodiment (part 1)
Figure 11:
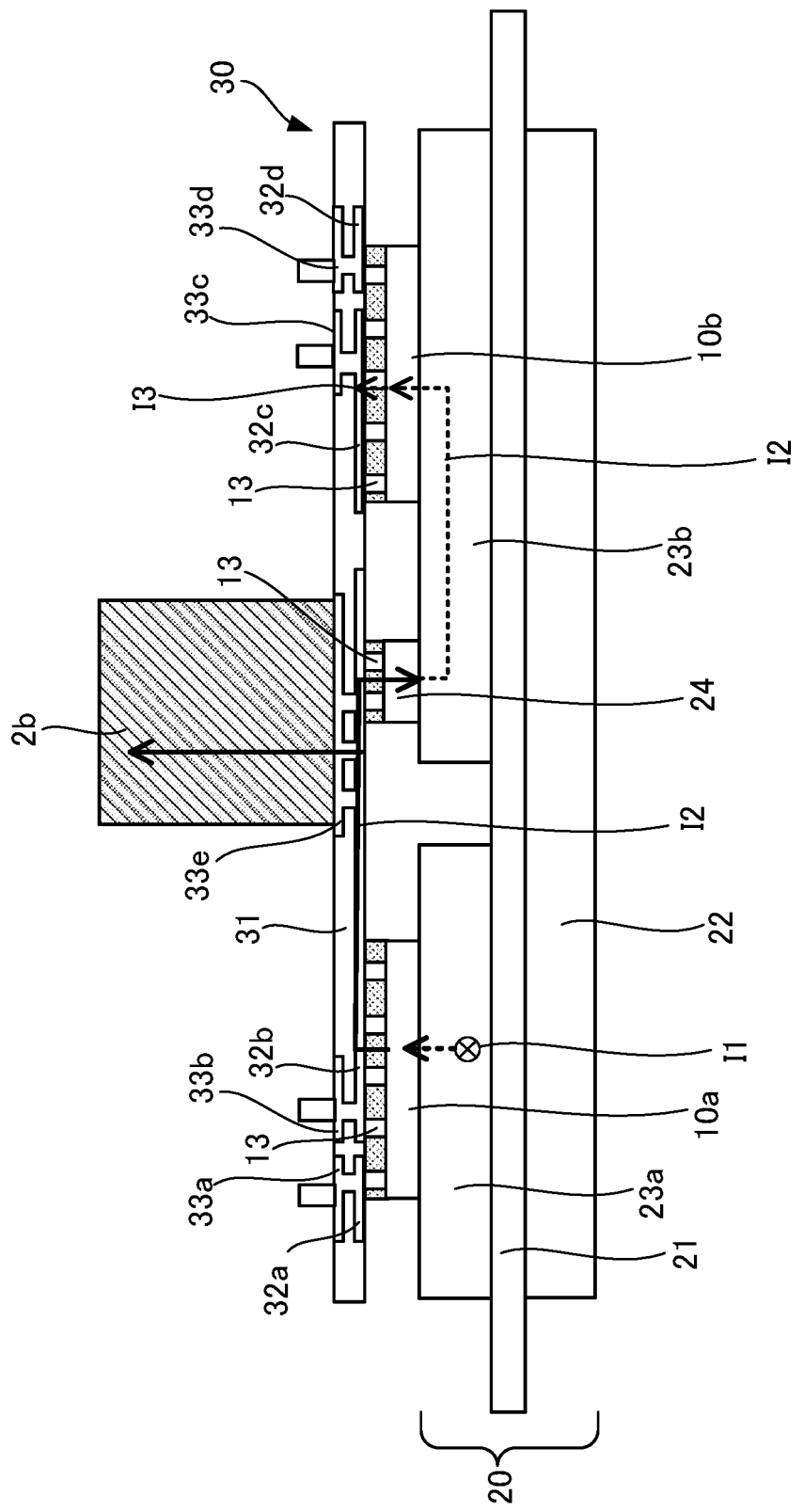
FIG. 11 is a view for describing a conduction path in the semiconductor module according to the embodiment (part 2)
Figure 12:
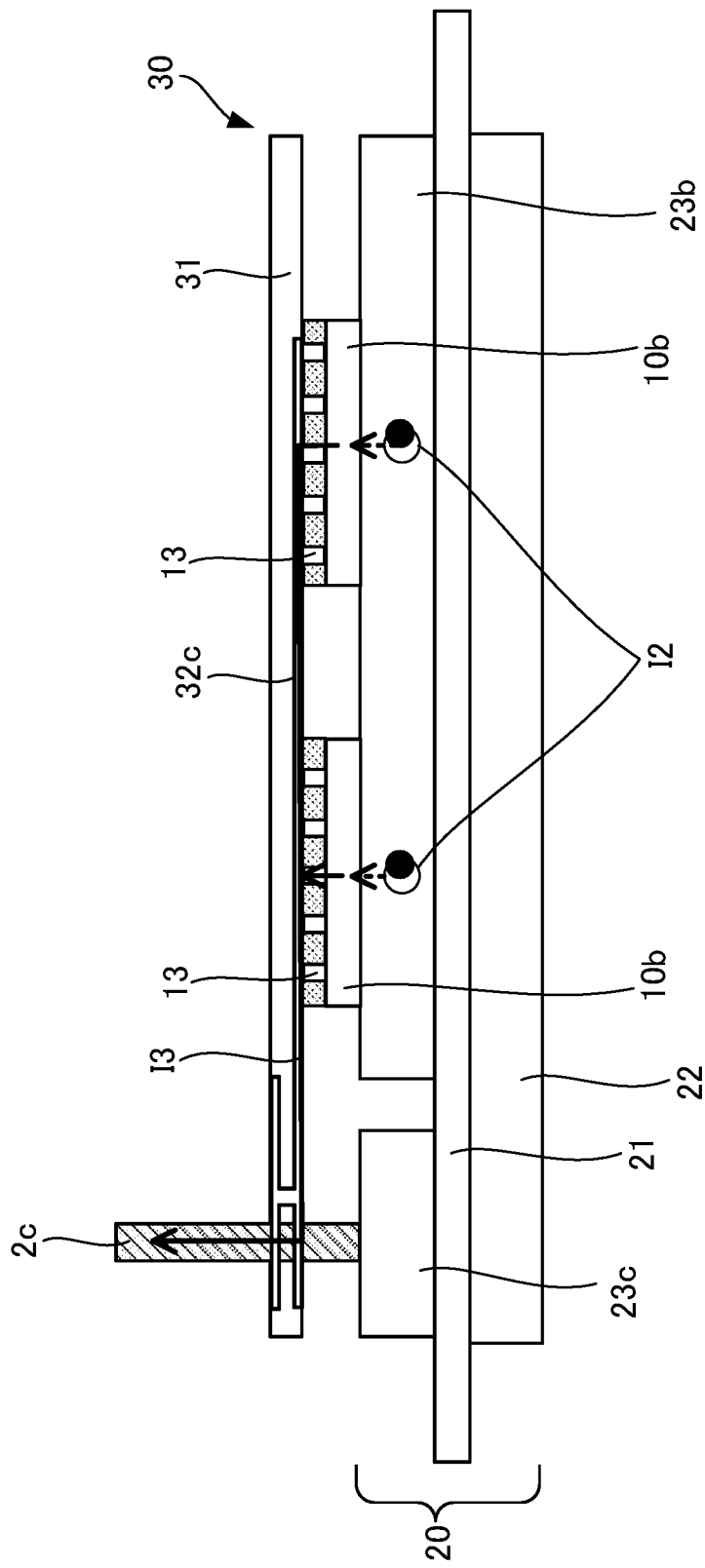
FIG. 12 is a view for describing a conduction path in the semiconductor module according to the embodiment (part 3)

A conduction path in the semiconductor module 1 having the above structure will now be described by the use of FIGS. 10 through 12, FIG. 9, and the like. FIGS. 10 through 12 are views for describing a conduction path in the semiconductor module according to the embodiment. In FIG. 9, the dashed arrows I1 and I2 indicate conduction paths (directions) in the conductive plates 23a and 23b of the ceramic circuit board 20, and the solid line arrows I2 and I3 indicate conduction paths (directions) in the wiring boards 32b and 32c (on the back surface) of the printed-circuit board 30. FIG. 10 is a sectional view taken along the dot-dash line C1-C1 of FIG. 2. FIG. 11 is a sectional view taken along the dot-dash line C2-C2 of FIG. 2. FIG. 12 is a sectional view taken along the dot-dash line C3-C3 of FIG. 2. Furthermore, dashed lines and solid lines I1, I2, and I3 in FIGS. 10 through 12 indicate conduction paths (directions) corresponding to FIG. 9. Moreover, in FIGS. 10 through 12, upper surface electrodes, lower surface electrodes, or control electrodes are not illustrated. In addition, a symbol indicated in the conductive plate 23a in FIG. 11 means that a current flows from this side to the back in FIG. 11. A symbol indicated in the conductive plate 23b in FIG. 12 means that a current flows from the back to this side in FIG. 12.

Furthermore, in the following description it is assumed that the semiconductor chips 10a and 10b included in the semiconductor module 1 are power MOSFETs and that a determined voltage is applied at determined timing to each of the external connection terminals 3a and 3d which are gate electrodes of the semiconductor module 1. In addition, a positive electrode is connected from the outside to the external connection terminal 2a which is a P terminal. A negative electrode is connected from the outside to the external connection terminal 2c which is an N terminal.

As illustrated in FIG. 10, first a current inputted from the external connection terminal 2a flows through the conductive plate 23a and is inputted to the lower surface electrodes of the semiconductor chips 10a (arrow I1 and the dashed arrow I1 of FIG. 9). The semiconductor chips 10a output output currents (arrows I2) from the upper surface electrodes 12a according to the current inputted from the lower surface electrodes and gate voltages applied to the control electrodes 11a. The output currents flow via the connecting members 13 into the wiring board 32b of the printed-circuit board 30 (solid line arrows I2 of FIG. 9). Accordingly, the upper arm illustrated in FIG. 5 is made up of the conductive plate 23a, the semiconductor chips 10a, the wiring boards 32a and 32b, and the wiring boards 33a and 33b.

As illustrated in FIG. 11, the output currents flowing into the wiring board 32b of the printed-circuit board 30 flow through the wiring board 32b and flow via the connecting members 13 into the conductive block 24. The output currents flowing into the conductive block 24 flow through the conductive plate 23b via the conductive block 24 and are inputted to the lower surface electrodes of the semiconductor chips 10b (dashed arrow I2 and the dashed arrows I2 of FIG. 9). The output currents flowing through the wiring board 32b in this way are outputted from the external connection terminal 2b. The semiconductor chips 10b output output currents from the upper surface electrodes 12b according to the output currents inputted from the lower surface electrodes and gate voltages inputted from the control electrodes 11b. The output currents flow via the connecting members 13 into the wiring board 32c of the printed-circuit board 30 (arrow I3).

As illustrated in FIG. 12, the output currents flowing into the wiring board 32c of the printed-circuit board 30 flow through the wiring board 32c and are outputted from the external connection terminal 2c which is an N terminal (arrow I3 and the solid line arrow I3 of FIG. 9). Accordingly, the lower arm illustrated in FIG. 5 is made up of the conductive plate 23b, the semiconductor chips 10b, the wiring boards 32c and 32d, and the wiring boards 33c and 33d.

As stated above, the semiconductor module 1 includes the ceramic circuit board 20 having the insulating plate 21 and the conductive plates 23a and 23b located side by side on the front surface of the insulating plate 21 and the external connection terminal 2a located on the front surface of the conductive plate 23a on the side of the long side 21a of the insulating plate 21. Furthermore, the semiconductor module 1 includes the semiconductor chips 10a and the semiconductor chips 10b. Each semiconductor chip 10a has the upper surface electrode 12a and the lower surface electrode and is disposed over the front surface of the conductive plate 23a on the side of the long side 21b of the insulating plate 21 from the external connection terminal 2a. Each semiconductor chip 10b has the upper surface electrode 12b and the lower surface electrode and is disposed over the front surface of the conductive plate 23b on the side of the long side 21b of the insulating plate 21. Moreover, the semiconductor module 1 includes the printed-circuit board 30. The printed-circuit board 30 has the insulating board 31 located opposite the front surface of the insulating plate 21 and the wiring boards 32b and 32c located over the principal plane of the insulating plate 21. The wiring board 32b electrically connects the upper surface electrode 12a and the relay area 23b1 on the conductive plate 23b on the conductive plate 23a side from the semiconductor chips 10b. The wiring board 32c is electrically connected to the upper surface electrode 12b and extends to the side of the long side 21a of the insulating plate 21. In addition, the semiconductor module includes the external connection terminal 2c electrically connected to the wiring board 32c on the side of the long side 21a of the insulating plate 21 and formed so as to be inserted into the insulating board 31.

As a result, a current inputted from the external connection terminal 2a of the semiconductor module 1 flows through the conductive plate 23a of the ceramic circuit board 20, the semiconductor chips 10a, the wiring board 32b of the printed-circuit board 30, the conductive block 24, the conductive plate 23b of the ceramic circuit board 20, the semiconductor chips 10b, and the wiring board 32c of the printed-circuit board 30 and is outputted from the external connection terminal 2c. That is to say, as illustrated in FIG. 9, with the semiconductor module 1 a current flows from the external connection terminal 2a to the external connection terminal 2c along a path having the shape of the letter "U." As a result, with the semiconductor module 1, the wiring length from the external connection terminal 2a to the external connection terminal 2c is shortened, and inductance is reduced. Moreover, with the semiconductor module 1, electrical connections are realized by the use of the connecting members 13 in gaps between the semiconductor chips 10a and 10b and located over the ceramic circuit board 20 and the printed-circuit board 30, and the connecting members 13 in the gaps are sealed with the sealing member 14. As a result, an interaction functions between wirings of the ceramic circuit board 20 and the printed-circuit board 30, and inductance is reduced. Furthermore, with the semiconductor module 1 according to the embodiment the two semiconductor chips 10a and the two semiconductor chips 10b are located. If three or more semiconductor chips 10a and three or more semiconductor chips 10b are located, then it is desirable to locate them in a line along the short sides 21c and 21d of the insulating plate 21. This suppresses an increase in the inductance. In addition, with the semiconductor module 1 gate voltages are applied from sides of the concave portions 32a1 and 32d1 of the wiring boards 32a and 32d of the printed-circuit board 30 via the wiring boards 33a and 33d of the printed-circuit board 30 to the control electrodes 11a and 11b of the two semiconductor chips 10a and the two semiconductor chips 10b, respectively. The portions from which the gate voltages are applied at this time are at approximately the same distance from the control electrodes 11a and 11b of the two semiconductor chips 10a and the two semiconductor chips 10b. This reduces variations in the timing of the switching operations of the semiconductor chips 10a and 10b and reduces variations in the characteristics at switching operation time.

Figure 13:
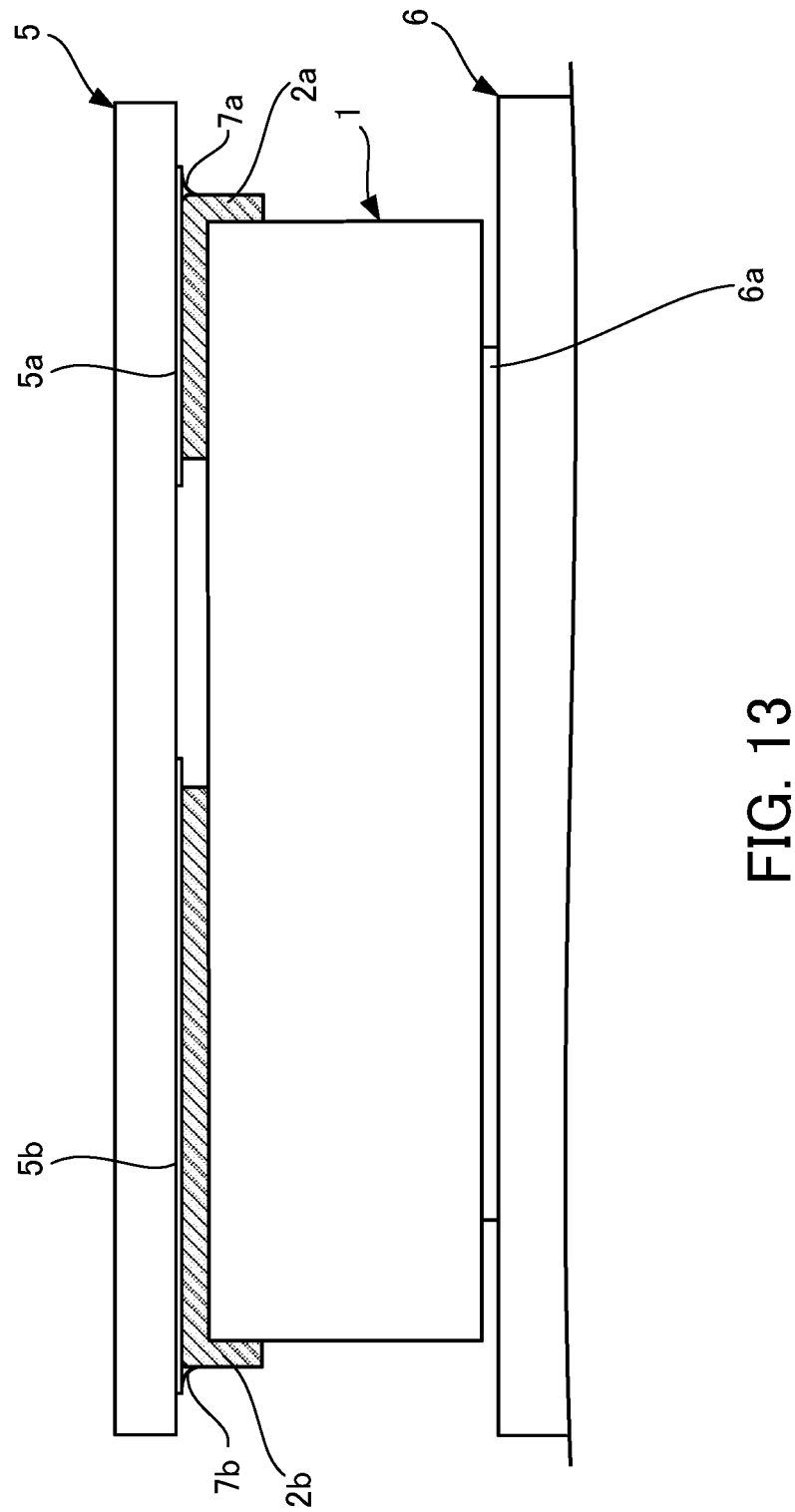
FIG. 13 illustrates an example of mounting the semiconductor module according to the embodiment.

An example of mounting the above semiconductor module 1 will now be described by the use of FIG. 13. FIG. 13 illustrates an example of mounting the semiconductor module according to the embodiment. FIG. 13 is a side view of the semiconductor module 1 of FIG. 1 viewed from the left side. The semiconductor module 1 is located with the back surface on a cooler 6 with a thermal interface material (TIM) 6a therebetween. A thermal compound, a phase change, a carbon sheet, metal bonding by solder, or the like may be used as the thermal interface material 6a. Furthermore, a printed-circuit board 5 is disposed over the front surface of the semiconductor module 1 and the external connection terminals 2a and 2b are electrically connected to wiring boards 5a and 5b, respectively, of the printed-circuit board 5. In this case, the external connection terminals 2a, 2b, 2c, 3a, 3b, 3c, and 3d of the semiconductor module 1 (external connection terminals 2a and 2b in FIG. 13) are bonded to wiring boards (wiring boards 5a and 5b in FIG. 13) of the printed-circuit board 5 by solder (solder 7a and solder 7b in FIG. 13) on sides of the semiconductor module 1 having the shape of a fillet.

As illustrated in FIG. 1, the external connection terminals 2a, 2b, 2c, 3a, 3b, 3c, and 3d of the semiconductor module 1 are exposed from the same front surface 4a of the sealing member 4. This makes it possible to mount the semiconductor module 1 on one side of the printed-circuit board 5. As a result, the wiring layout property of the printed-circuit board 5 is improved compared with the conventional through-hole mounting. Furthermore, the total inductance of a system including the printed-circuit board 5 is decreased. Moreover, the external connection terminals 2a, 2b, and 2c, and the external connection terminals 3a, 3b, 3c, and 3d of the semiconductor module 1 are exposed from sides of the sealing member 4 opposite each other. Accordingly, the external connection terminals 2a, 2b, 2c, 3a, 3b, 3c, and 3d are bonded to the printed-circuit board 5 from the sides of the semiconductor module 1 by the solder (solder 7a and the solder 7b in FIG. 13) having the shape of a fillet. As a result, the external connection terminals 2a, 2b, 2c, 3a, 3b, 3c, and 3d are properly bonded to the printed-circuit board 5, and deterioration in the reliability of the semiconductor module 1 is suppressed.

According to the disclosed technique, an increase in inductance in a semiconductor module is suppressed, and deterioration in the reliability of the semiconductor module is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor module, comprising:
   a board including
     a first insulating plate of a substantially rectangular shape having two long sides the first insulating plate having a first edge portion at one of the two long sides and a second edge portion at the other of the two long sides, and
     a first conductive plate and a second conductive plate located side by side on a front surface of the first insulating plate;
   a first external connection terminal located on a front surface of the first conductive plate above the first edge portion of the first insulating plate;
   a first semiconductor chip with an upper surface electrode and a lower surface electrode, which are respectively a first upper surface electrode and a first lower surface electrode of the semiconductor module, the first lower surface electrode being disposed on the front surface of the first conductive plate, and being closer to the second edge portion of the first insulating plate than the first external connection terminal;
   a second semiconductor chip with an upper surface electrode and a lower surface electrode, which are respectively a second upper surface electrode and a second lower surface electrode of the semiconductor module, the second lower surface electrode being disposed on a front surface of the second conductive plate, and being closer to the second edge portion of the first insulating plate than the first external connection terminal;
   a printed-circuit board including
     a second insulating plate having
       a first principal plane facing the front surface of the first insulating plate, and a second principal plane opposite to the first principal plane, a first wiring board which is located on the first principal plane and which electrically connects the first upper surface electrode and a relay area on the front surface of the second conductive plate, the first wiring board being closer to the first conductive plate than the second semiconductor chip, and a second wiring board located on the first principal plane, electrically connected to the second upper surface electrode, and extending towards the first edge portion of the first insulating plate; and a second external connection terminal electrically connected to an end portion of the second wiring board and formed on the second principal plane of the second insulating plate.

2. The semiconductor module according to claim 1, further comprising a third external connection terminal electrically connected to a portion of the second wiring board that corresponds to the relay area, the third external connection terminal being formed on the second principal plane of the second insulating plate.

3. The semiconductor module according to claim 2, wherein
the first external connection terminal has a first end portion and a second end portion, the first end portion thereof being connected to the first conductive plate,
the second external connection terminal has a first end portion and a second end portion, the first end portion thereof being connected to the printed-circuit board, and
the third external connection terminal has a first end portion and a second end portion, the first end portion thereof being connected to the printed-circuit board, and
the semiconductor module further comprises a sealing member that seals the second end portion of the first external connection terminal, the second end portion of the second external connection terminal, and the second end portion of the third external connection terminal as a whole, and that exposes a back surface of the board.

4. The semiconductor module according to claim 3, wherein the first external connection terminal, the second external connection terminal, and the third external connection terminal are exposed from a same surface of the sealing member.

5. The semiconductor module according to claim 4, wherein:
the first external connection terminal and the second external connection terminal are exposed from the sealing member on a first side thereof; and
the third external connection terminal is exposed from the sealing member on a second side thereof that is opposite to the first side.

6. The semiconductor module according to claim 1, wherein:
the board has a third conductive plate on the front surface of the first insulating plate, the third conductive plate being closer to the first edge portion of the first insulating plate than the second conductive plate;
one edge portion of the second external connection terminal is formed on the third conductive plate; and
the second external connection terminal is inserted into the second insulating plate from the first principal plane to the second principal plane thereof.

7. The semiconductor module according to claim 1, further comprising connecting members which electrically connect the first upper surface electrode and the first wiring board, and which electrically connect the second upper surface electrode and the second wiring board.

8. The semiconductor module according to claim 7, wherein the connecting members are bumps.

9. The semiconductor module according to claim 8, wherein each of the first semiconductor chip and the second semiconductor chip is made of a wide-band-gap semiconductor.

10. The semiconductor module according to claim 9, wherein the wide-band-gap semiconductor is silicon carbide, gallium nitride, or gallium oxide.

11. The semiconductor module according to claim 7, further comprising a conductive block located in the relay area and electrically connected via the connecting members to the first wiring board.

12. The semiconductor module according to claim 1, wherein:
the first semiconductor chip has a control electrode that is a first control electrode of the semiconductor module, the first control electrode being formed on a same surface on which the first upper surface electrode is situated, and being farther to the second conductive plate than the first upper surface electrode;
the second semiconductor chip has a control electrode that is a second control electrode of the semiconductor module, the second control electrode being formed on a same surface on which the second upper surface electrode is situated, and being farther to the first conductive plate than the second upper surface electrode; and
the semiconductor module further includes
a third wiring board electrically connected to the first control electrode, the third wiring board being located on the second principal plane of the second insulating plate of the printed-circuit board, the second and third wiring boards being on different sides with respect to the first wiring board, and
a fourth wiring board electrically connected to the second control electrode, the fourth wiring board being located on the second principal plane of the second insulating plate of the printed-circuit board, the first and fourth wiring boards being on different sides with respect to the second wiring board.

13. The semiconductor module according to claim 12, wherein:
the first semiconductor chip and the second semiconductor chip are provided in plurality;
the first semiconductor chips are disposed in a first line, and the second semiconductor chips are disposed in a second line in parallel to the first line;
the third wiring board has a fourth external connection terminal electrically connected to the first control electrode and located in an area corresponding to a middle of the first line; and
the fourth wiring board has a fifth external connection terminal electrically connected to the second control electrode and located in an area corresponding to a middle of the second line.

* * * * *